US010877105B1

(12) United States Patent
Aromin et al.

(10) Patent No.: US 10,877,105 B1
(45) Date of Patent: Dec. 29, 2020

(54) TESTGUARD CIRCUIT

(71) Applicant: Tower Manufacturing Corporation, Providence, RI (US)

(72) Inventors: Victor V Aromin, West Warwick, RI (US); Louis J. Shatkin, Warwick, RI (US)

(73) Assignee: TOWER MANUFACTURING CORPORATION, Providence, RI (US)

( * ) Notice: Subject to any disclaimer, the term of this patent is extended or adjusted under 35 U.S.C. 154(b) by 0 days.

(21) Appl. No.: 16/909,112

(22) Filed: Jun. 23, 2020

(51) Int. Cl.
*G01R 31/52* (2020.01)
*G01R 31/58* (2020.01)
*H02H 3/00* (2006.01)
*H02H 3/08* (2006.01)
*H01H 75/00* (2006.01)

(52) U.S. Cl.
CPC ............. *G01R 31/52* (2020.01); *G01R 31/58* (2020.01); *H02H 3/00* (2013.01); *H01H 75/00* (2013.01); *H02H 3/08* (2013.01)

(58) Field of Classification Search
USPC .......................................................... 361/42
See application file for complete search history.

(56) References Cited

U.S. PATENT DOCUMENTS

| 2007/0030608 | A1* | 2/2007 | Baldwin | H02H 3/335 361/42 |
| 2008/0024945 | A1* | 1/2008 | Gao | H01H 83/04 361/42 |
| 2013/0242440 | A1* | 9/2013 | Bonasia | H02H 3/08 361/49 |
| 2014/0098446 | A1* | 4/2014 | Aromin | H02H 3/16 361/42 |

* cited by examiner

*Primary Examiner* — Danny Nguyen

(57) ABSTRACT

A Testguard circuit with auto-monitoring and end-of-life circuitry is provided. The Testguard circuit interrupts the flow of current through a pair of lines, wherein one of the pair of lines extends between a line input and a line output and the other line extends between a neutral input and a neutral output. The Testguard circuit includes a monitoring module for detecting an end of life condition. The monitoring module includes a simulated ground fault generator for simulating a ground fault; an auto-monitoring logic module; a relay synchronized switch; and an end-of-life switch for disabling the Testguard circuit if certain Testguard component failures are detected.

12 Claims, 1 Drawing Sheet

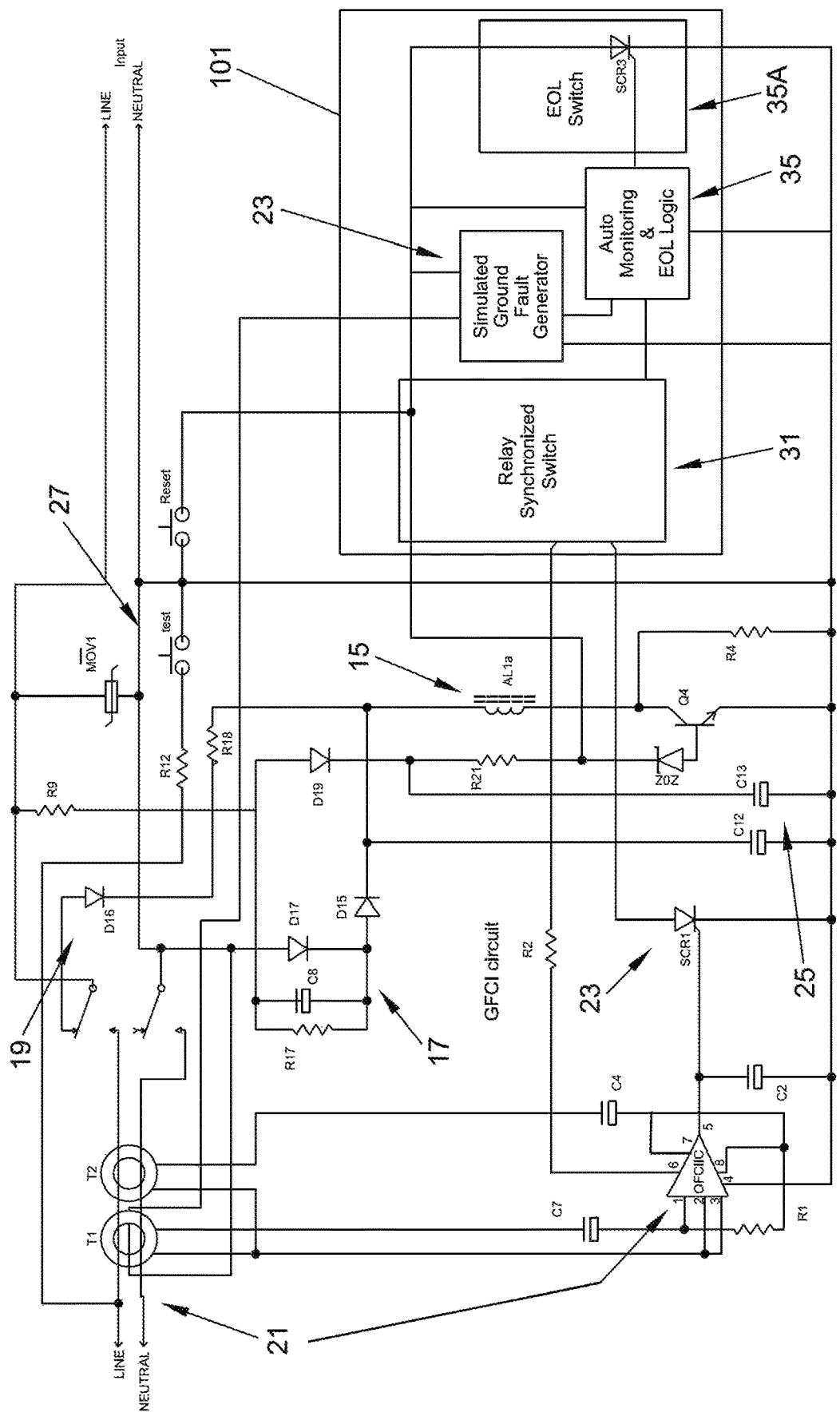

TESTGUARD CIRCUIT

1. FIELD OF USE

The present invention relates generally to electrical safety devices and more particularly to a Testguard circuit with auto monitoring and end-of-life circuitry.

2. DESCRIPTION OF PRIOR ART (BACKGROUND)

Conventional electrical appliances typically receive alternating current (AC) power from a power supply, such as an electrical outlet, through a pair of conducting lines. The pair of conducting lines, often referred to as the line and neutral conductors, enable the electrical appliance, or load, to receive the current necessary to operate.

The connection of an electrical appliance to a power supply by a pair of conducting lines creates a number of potentially dangerous conditions. In particular, there exists the risk of ground fault, leakage currents and grounded neutral conditions in the conducting lines. When a ground fault or leakage current condition occurs it creates an imbalance between the currents flowing in the line and neutral conductors. A grounded neutral condition occurs when the neutral conductor is grounded at the load. A ground fault condition is extremely dangerous and can result in serious injury.

Ground fault and leakage current interrupters include circuit breakers, receptacles, portable and cord mounted protection devices. They may be troubled by false tripping, even though they pass all present industry standards. One cause of false tripping is disconnection of the power to inductive appliances, particularly by unplugging the appliances.

Examples of these appliances include electric shavers, high intensity lamps, and small cooling fans, such as are used for cooling electronic equipment. Unplugging these appliances generates an arc between the plug and the receptacle, resulting in the superimposition of several volts of wide band noise onto the power line. Due to the wide band nature of the noise, even a very small stray coupling capacitance will couple the noise from the power line conductor into the ground fault circuit, causing a false trip.

Grounded neutral detection is provided by a dormant oscillator circuit configuration. The detector circuit includes first and second sensor coils through which the line and neutral conductors of the protected circuit pass. If a load side grounded neutral condition occurs, both cores sensor coils are coupled together to create an oscillating signal that is applied through a coupling capacitor to the above-described operational amplifier followed by a window comparator, this action generates a trip signal.

It has been found that wide band noise induced by load related switching phenomena such as is caused by unplugging inductive appliances causes false tripping of the ground fault interrupter.

Ground fault circuit and leakage current interrupters are well known in the art and are commonly used to protect against ground fault, leakage currents and grounded neutral conditions. In general, GFCI devices sense the presence of ground fault and grounded neutral conditions in the conducting lines and in response thereto, open at least one of the conducting lines between the power supply and the load to eliminate the dangerous condition.

In U.S. Pat. No. 5,177,657, to M. Baer et al, there is disclosed a ground fault interrupter circuit which interrupts the flow of current to a pair of lines extending between a source of power and a load. The ground fault interrupter circuit includes a circuit breaker comprising a normally open switch located in one or both of the lines, a relay circuit for selectively closing the normally open switch, an electronic latch circuit operable in first and second bi-stable states and a fault sensing circuit for sensing the presence of a fault condition in at least one of the lines. The electronic latch circuit causes the relay circuit to close the normally open switch and maintain the normally open switch in its closed position when the electronic latch circuit is in the first bi-stable state. The electronic latch circuit also causes the relay circuit to permit the normally open switch to return to its normally open condition when the latch circuit is in its second bi-stable state. A fault sensing circuit senses the presence of a fault condition in at least one of the lines and causes the electronic latch to latch in its second state upon detection of the fault condition.

In U.S. Pat. No. 5,418,678 to T. M. McDonald, there is disclosed an improved ground fault circuit interrupter (GFCI) device which requires manual setting following initial connection to an AC power source or termination of a power source interruption. The improved GFCI device utilizes a controlled switching device which is responsive to a load power signal for allowing the relay contact sets of the GFCI device to be closed only when power is being made available at the output or load terminals. The controlled switching device preferably comprises an opto-isolator or other type of switching device which provides isolation between the GFCI input and output terminals when the relay contact sets are open. The improved GFCI device may be incorporated into portable units, such as plug-in or line cord units, for use with unprotected AC receptacles.

In U.S. Pat. No. 4,816,957 to L. F. Irwin there is disclosed an adapter unit comprising a moisture resistant housing within which is carried an improved, self-testing ground line fault interrupter device. The improved device is electrically interconnected with a connector carried externally of the adapter housing so that the unit can be plugged directly into a standard duplex outlet of an existing circuit. The apparatus includes circuitry that automatically tests the operability of the device when it is plugged into a duplex outlet without the need for manual manipulation of test buttons or other overt action by the user.

In U.S. Pat. No. 4,578,732 to C. W. Draper et al there is disclosed a wall socket type ground fault circuit interrupter having a pair of sockets, a reset button and a test button that are accessible from the front of the interrupter. The interrupter has latched snap-acting contacts and a novel latching relay structure for maintaining the snap-acting contacts in a circuit making position. The snap-acting contacts permit all of the components including the monitoring toroids (sensing transformers) and the power supply to be respectively located and connected at the load side of the snap-acting contacts so that all of the circuits of the interrupter are de-energized when the contacts snap to a circuit opening position. The snap-acting contact mechanism and relay are provided with structures which provide the interrupter with a trip-free mode of contact actuation and accordingly a tease-proof snap-acting contact operation.

One drawback of GFCI devices of the type described above is that the GFCI device generally includes a large solenoid to selectively open and close the switching device. Specifically, the solenoid generally requires a constant supply of line voltage (approximately 120 volts) in order to switch and sustain the solenoid in its energized state. As a consequence, the solenoid acts as a large power drain source.

UL943 now requires all GFCIs to indicate "end of life" if the device fails to trip when the test button is manually operated. However, even if end-users regularly tested their devices, a GFCI device that did not test properly could nevertheless be reset, and continue to provide power, without providing ground-fault protection. Without a built-in power denial feature, a consumer could erroneously and tragically assume that if power is available, so is protection. Many end users were (and continue to remain) unaware of the need for regular testing, despite manufacturers' warnings; and others, who were aware, were not always conscientious in performing the testing. The latest edition of UL943 has introduced requirements for all GFCI's to include "auto monitoring" (AM) and "end of life" (EOL), whereby the GFCI will test itself at regular intervals (AM), in the case of a GFCI circuit failure provide a user indication and remove itself from service (EOL).

Auto monitoring (AM), end-of-life (EOL) typical events are the ground fault sensing components (toroids and integrated circuit) are open or short circuited; the trip solenoid and/or its control circuit is faulty, or the switching semiconductor (SCR) controlling the trip solenoid control circuit is open or short circuited.

Thus, there is a need for a solenoid of sufficient rating for use in a line voltage GFCI device but with reduced tendency to fail due to high voltages and currents associated with typical line voltages. There is also a need for a ground fault interrupter which does not generate a false trip in response to wide band noise in the protected circuit. There is also a need for such a ground fault circuit with improved immunity to wide band noise which also responds to sputtering arc faults.

There is also a need for a Testguard circuit with manual and automatic testing of the often-failed components of a GFCI and denial of power if testing fails.

SUMMARY OF THE INVENTION

It is an object of the present invention to provide a new and improved Testguard Circuit comprising a ground fault circuit interrupter (GFCI) and an auto-monitoring and end-of-life (EOL) circuit.

It is another object of the present invention to provide a Testguard Circuit which senses the presence of ground fault and grounded neutral conditions in the conducting lines, and in response thereto, includes a solenoid which opens at least one of the conducting lines between the power supply and the load.

It is yet another object of the present invention to provide a Testguard Circuit of the type described above wherein the solenoid can be energized and sustained in the energized state with minimal power drain.

It is still another object of the present invention to provide a Testguard Circuit of the type described above wherein the solenoid can be energized and sustained in the energized state with minimal heat build-up.

It is another object of the present invention to provide manual and automatic testing of the Testguard Circuit and provide an end-of-life indication if either the manual or automatic testing fails.

A Testguard Circuit constructed according to this invention for interrupting the flow of current through a pair of lines extending between a source of power and a load comprises a circuit breaker having a switch located in each of the lines, the switch having a first position in which the source of power in its associated line is not connected to the load and a second position in which the source of power in its associated line is connected to the load, a relay circuit for selectively moving and maintaining the switch in either the first position or the second position. The GFCI circuit includes an auto monitoring and end of life (AMEOL) module for detecting an end of life condition. The monitoring module includes a simulated ground fault generator for simulating a ground fault; a monitoring logic module; a relay synchronized switch; and an end-of-life switch for disabling the GFCI circuit if certain GFCI component failures are detected. Tested components include a GFCI integrated circuit, a relay shut off switch, and GFCI transformer detecting coils.

Additional objects, as well as features and advantages, of the present invention will be set forth in part in the description which follows, and in part will be obvious from the description or may be learned by practice of the invention. In the description, reference is made to the accompanying drawings which form a part thereof and in which is shown by way of illustration specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

The accompanying drawings, which are hereby incorporated into and constitute a part of this specification, illustrate various embodiments of the invention and, together with the description, serve to explain the principles of the invention. In the drawings wherein like reference numerals represent like parts:

FIG. 1 is a schematic circuit diagram of a ground fault circuit interrupter (GFCI) with monitoring features of the present invention.

DETAILED DESCRIPTION

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example; and If the specification states a component or feature "may," "can," "could," "should," "preferably," "possibly," "typically," "optionally," "for example," or "might" (or other such language) be included or have a characteristic, that particular component or feature is not required to be included or to have the characteristic.

Referring now to FIG. 1, there is shown a Testguard circuit including ground fault circuit interrupter (hereinafter GFCI) circuit constructed according to the teachings of the present invention, and end of life (herein after monitoring) module.

As will be discussed in detail below, the GFCI automatically protects a load from ground fault conditions upon the initial connection of Input L to Load L and Input N to Load N. Furthermore, once GFCI protects the load from a ground fault condition, GFCI 11 can be reset to protect against further ground fault conditions.

GFCI circuit shown in FIG. 1 includes components arranged as shown and discussed herein. The GFCI circuit includes ganged switches SW1 and SW2, a relay circuit 15, a power supply circuit 17, a booster circuit 19, a fault detection circuit 21 for detecting an electrical fault, a bi-stable electronic latch circuit 23, a filter circuit 25, and a test circuit 27. Also shown in FIG. 1 is a monitoring circuit 101. The monitoring circuit includes a relay synchronized switch 31, a simulated ground fault generator 33, an end of life logic circuit 35, and End of Life Switch 35A.

Switches SW1 and SW2 are located in the line and neutral conductive lines, respectively, between a power source and a load. Switches SW1 and SW2 can be positioned in either of two connective positions. In the first connective position, which is illustrated in FIG. 1, switches SW1 and SW2 are positioned such that the input power source is connected to the load and also connected to booster circuit 19. In the second connective position, which is the opposite position illustrated in FIG. 1, switches SW1 and SW2 are positioned such that the input power source is connected to the load but not to booster circuit 19. In both positions, the input power source is connected to power supply 17.

Relay circuit 15 acts to selectively position switches SW1 and SW2 in either its first connective position or its second connective position. Relay circuit 15 comprises a solenoid RL1a, transistor Q2, Zener ZD2, Resistors R4 and R21.

Solenoid RL1A is ganged to the circuit breaker contacts of switches SW1 and SW2 and is responsible for selectively controlling the connective position of switches SW1 and SW2. Before power is applied to GFCI 11, solenoid RL1A positions switches SW1 and SW2 are in the first connective position as shown. When solenoid RL1A is energized, solenoid RL1A positions switches SW1 and SW2 to the second connective position.

It should be noted that the particular construction of solenoid RL1A is unique for conventional GFCI devices. In particular, RL1A is significantly small in size and requires less power than most solenoids used in prior art GFCI devices. Specifically, solenoid RL1A has a coil resistance of approximately 5,000 ohms. As a result of the unique construction of solenoid RL1A, line voltage (approximately 120 volts RMS) must be directly supplied to solenoid RL1A in order to initially energize solenoid RL1A.

Once energized, a minimum constant voltage of approximately 28 volts DC is required to be supplied to solenoid RL1A in order to keep it in its energized state. As will be discussed in detail below, booster circuit 19 provides the line voltage to initially energize solenoid RL1A from its de-energized state and power supply circuit 17 supplies the minimum constant voltage of approximately 28 volts to maintain solenoid RL1A in its energized state. The reduction in the voltage required to maintain solenoid RL1A in its energized state (approximately 83 volts) significantly reduces the power drain of RL1A and also reduces heat build-up which would minimize solenoid RL1A useful life.

Transistor Q2 controls current flow through energized solenoid RL1A. When transistor is "off", current through solenoid RL1A is disabled and RL1A is deenergized. When transistor Q2 is "on", current flows through solenoid RL1A, energizing RL1A.

Power supply circuit 17 provides power for the GFCI circuit. Power supply circuit 17 comprises rectifier diodes D15, D17, D19, voltage dropping resistors R9 and R17, and capacitor C8. It will be appreciated that capacitor C8 reactance limits the current flowing though rectifiers D15 and D17. Also shown in FIG. 1, is Varistor MOV1 which has a value of 150 volts and acts to protect against a voltage surge from the AC power source.

Silicon rectifiers D15, D17 and D19 convert the AC current in the line from the power source into a DC current. Voltage dropping resistors R9 and R17 limit the constant input voltage supplied to solenoid RL1A for the reasons noted above. Capacitor C8 limits the current flowing though rectifiers D15 and D17 and the constant voltage supplied to solenoid RL1A. It will be appreciated that an objective of the capacitive supply circuit arrangement minimizes heat buildup in a confined space, optimizes relay coil SOL 1 energy to substantially increase the switch contact forces, providing for a smaller, more rugged and higher product performance for the GFCI.

Booster circuit 19 to provide a temporary voltage sufficient to initially energize solenoid RL1A from its de-energized state. Booster circuit 19 comprises silicon rectifier D16 and a surge limit resistor R18. When switch SW1 is in its first position and upon the application of power to GFCI, rectifier D16 provides an instant DC voltage, approximately 126V DC average, to solenoid RL1A causing solenoid RL1A to energize which, in turn, causes solenoid RL1A to move switches SW1 and SW2 to their second connective position. When switches SW1 and SW2 are moved to their second connective position, booster circuit 19 is disconnected from the power source. Resistor R18 protect rectifier D16 from over currents.

Fault detection circuit 21 detects both ground fault and grounded neutral conditions in the conductive lines when switches SW1 and SW2 are in their second connective position. Fault detection circuit 21 comprises a sense transformer T1, a grounded neutral transformer T2, a coupling capacitor C7, a noise suppression capacitor C6, a feedback resistor R3, and a ground fault interrupter integrated circuit GFCI IC.

Sense transformer T1 senses an electrical fault such as the current differential between the line and neutral conductive lines and upon the presence of a ground fault condition, transformer T1 induces an associated output from its secondary windings. Grounded neutral transformer T2 acts in conjunction with transformer T1 to sense the presence of grounded neutral conditions and, in turn, induce an associated output. Coupling capacitor C7 acts to couple the AC signal from the secondary winding of transformer T1 to GFCI IC. Capacitor C6 acts to prevent fault detection circuit 21 from operating in response to line disturbances such as electrical noise and lower level faults.

Together capacitor C6 and resistor R3 act to set the minimum fault current at which fault detection circuit 21 provides an output signal to latch circuit 23. GFCI IC amplifies a fault signal generated by transformer T1 and generates an output pulse on pin 5 to activate latch circuit 23.

Upon detection of a ground fault or grounded neutral condition GFCI IC generates an output pulse on pin 5 to activate latch circuit 23. Activated Latch Circuit 23 deactivates or de-energizes solenoid RL1A. Latch circuit 23 comprises a silicon-controlled rectifier SCR1 operable in either a conductive or a non-conductive state, and a noise suppression capacitor C2.

SCR1 selectively turns on and off transistor Q2 in relay circuit 15 via Relay Synchronized Switch 31, discussed in more detail herein. Noise suppression capacitor C2 acts to prevent rectifier SCR1, when in its nonconductive state, from firing as a result of electrical noise. Reset switch is a conventional push-in type switch and when depressed, effects the removal of holding current from the anode of rectifier SCR1, causing rectifier SCR1 to turn off when it is in its conductive state.

Test circuit 27 provides a means of testing whether the GFCI circuit is functioning properly. Test circuit 27 comprises a test switch of conventional push-in type design. When the test switch is depressed to energize test circuit 27, resistor R12 provides a simulated fault current to transformer T1 which is similar to a ground fault condition.

In use, GFCI 11 functions in the following manner. Prior to initial connection, switches SW1 and SW2 are normally in their first connective position as shown in FIG. 1.

Upon initial connection of GFCI 11 at one end to the load and at the other end to the power source, line voltage of approximately 120 volts RMS is applied to solenoid RL1A through booster circuit 19 and energizes solenoid RL1A. Once solenoid RL1A is energized, solenoid RL1A causes switches SW1 and SW2 to move into their second connective position (opposite the position shown in FIG. 1), thereby eliminating the supply of power into solenoid RL1A from booster circuit 19. However, since a minimum constant 28 volts is supplied to solenoid RL1A from power supply circuit 17, solenoid RL1A is maintained in its energized state.

With solenoid RL1A maintained in its energized state rectifier SCR1 is in a nonconductive state and transistor Q2 is on, which enables current to pass to solenoid RL1A. Upon the detection of a ground fault or grounded neutral condition, fault detection circuit 21 sends a gate signal to rectifier SCR1 causing rectifier SCR1 to be in a conductive state which, in turn, turns off transistor Q2. With transistor Q2 off, current does not pass through solenoid RL1A and therefore solenoid RL1A becomes de-energized. Once de-energized, solenoid RL1A causes switches SW1 and SW2 to return to its first connective position, thereby cutting off power from the power source to the load.

Once the fault condition is removed, the GFCI circuit can be reset by manually depressing the RESET switch. Depression of RESET switch effects the removal of SCR1 holding current, which turns off rectifier SCR1. This, in turn, turns transistor Q2 back on when the RESET switch is released which enables solenoid RL1A to become re-energized.

With the load plugged into the power source, if there is a loss of power at the power source, solenoid RL1A will become de-energized, moving switches SW1 and SW2 back to their first connective position. When power is subsequently restored, solenoid RL1A will become re-energized again, which in turn moves switches SW1 and SW2 to their second position.

Auto Monitoring and End of Life

The monitoring module 101 includes a relay synchronized switch 31, a simulated ground fault generator 33, an auto monitoring and end of life circuit 35, and End of Life Switch 35A.

Simulated ground fault generator circuit 33 includes the logic and means necessary to simulate a periodic ground fault.

Relay Synchronized Switch 31 includes the logic and means necessary to temporarily turn off the normal GFCI fault detection described above when the simulated ground fault generator circuit 33 simulates a periodic ground fault for the purpose of testing the ground fault detection circuit. The tested GFCI components include the sense transformer T1, the grounded transformer T2, the GFCI IC and the bi-stable electronic latch circuit SCR1.

The auto-monitoring and EOL logic (monitoring) circuit 35 measures a predetermined number of simulated GFCI fault detection failures. Upon determining the GFCI fault detection circuitry is defective the EOL switch 35A is activated, thus turning off Q2 and solenoid RL1a. In addition, the monitoring circuit includes the logic and means for auto-monitoring the monitoring logic module and the EOL switch.

The versions of the present invention described above are intended to be merely exemplary and those skilled in the art shall be able to make numerous variations and modifications to it without departing from the spirit of the present invention. All such variations and modifications are intended to be within the scope of the present invention as defined in the appended claims. For example, it should be noted that the particular components which make up the aforementioned embodiments may be interchanged or combined to form additional embodiments. For example, the AMEOL circuitry described may be used in any suitable device that requires auto monitoring and end of life features.

What is claimed is:

1. A test guard circuit for interrupting the flow of current through a pair of lines, wherein one of the pair of lines extends between a line input and a line output and the other line extends between a neutral input and a neutral output, the test guard circuit comprising:
    a ground fault circuit interrupter (GFCI) wherein the GFCI comprises:
        a first switch having a first input terminal and a first contact terminal;
        a second switch having a second input terminal and a second contact terminal, wherein the first switch is ganged to the second switch;
        a relay circuit for controlling the first and second switches, wherein each of the switches comprises a first non-energized position and a second energized position and wherein the first switch is connected between the line input and the line output and the second switch is connected between the neural input and the neutral output;
        a power supply circuit for powering the relay circuit, wherein, the power supply circuit comprises:
            a plurality of power supply diodes connected to the line input; and
            a capacitive supply circuit connected to the plurality of power diodes and the relay circuit, wherein the capacitive supply circuits minimizes heat buildup and increases switch contact forces between the first input terminal and the first contact terminal and the second input terminal and the second contact terminal;
        a booster circuit for initializing the relay circuit;
        a fault detection circuit for detecting a ground fault in the pair of lines;
        a first bi-stable electronic latch circuit for deenergizing the relay circuit when a fault is detected;

a monitoring module integrated with the GFCI, the monitoring module comprising:
  a simulated ground fault generator for simulating a ground fault;
  an auto-monitoring logic module;
  a relay synchronized switch; and
  an end-of-life switch for disabling the relay circuit.

2. The test guard circuit as in claim 1 wherein the booster circuit comprises a diode connected to the first switch deenergized position.

3. The test guard circuit as in claim 1 wherein the fault detection circuit comprises:
  a sense transformer;
  a grounded neutral transformer; and
  a GFCI Integrated Circuit (IC) coupled to the sense transformer and the grounded neutral transformer.

4. The test guard circuit as in claim 1 wherein the bi-stable electronic latch circuit comprises a first silicon-controlled rectifier operable in either a conductive or a non-conductive state.

5. The test guard circuit as in claim 3 wherein the simulated ground fault generator for simulating comprises a ground fault signal to be detected by the GFCI circuit.

6. The test guard circuit as in claim 5 wherein the auto-monitoring logic module comprises a predetermined number of failures of the GFCI circuit in response to the simulated ground fault signals to test the GFCI circuit, wherein the tested GFCI circuit comprises:
  the sense transformer;
  the grounded neutral transformer;
  the GFCI Integrated Circuit (IC) coupled to the sense transformer and the grounded neutral transformer; and the
  first bi-stable electronic latch circuit.

7. The test guard circuit as in claim 5 wherein the relay synchronized switch comprises GFCI fault detection by synchronizing the relay circuit with the generated ground fault signals to maintain the first and second switch in the second energized position.

8. The test guard circuit as in claim 1 wherein the end-of-life (EOL) switch for disabling the relay circuit comprises a second bi-stable electronic latch circuit operable in response to a signal from the auto-monitoring logic module for returning the first and second switches to the first deenergized position.

9. A GFCI test guard circuit for interrupting the flow of current through a pair of lines, wherein one of the pair of lines extends between a line input and a line output and the other line extends between a neutral input and a neutral output, the GFCI test guard circuit comprising:
  a ground fault circuit interrupter (GFCI) wherein the GFCI comprises:
    a first switch having a first input terminal and a first contact terminal;
    a second switch having a second input terminal and a second contact terminal, wherein the first switch is ganged to the second switch;
    a relay circuit for controlling the first and second switches, wherein each of the switches comprises a first non-energized position and a second energized position and wherein the first switch is connected between the line input and the line output and the second switch is connected between the neural input and the neutral output;
    a power supply circuit for powering the relay circuit, the power supply circuit comprising:
      a plurality of power supply diodes connected to the line input; and
      a capacitive supply circuit connected to the plurality of power diodes and the relay circuit, wherein the capacitive supply circuits minimizes heat buildup and increases switch contact forces between the first input terminal and the first contact terminal and the second input terminal and the second contact terminal;
    a booster circuit for initializing the relay circuit, wherein the booster circuit comprises:
      a diode connected to the first switch first position;
    a fault detection circuit for detecting a ground fault in the pair of lines;
    a first bi-stable electronic latch circuit for deenergizing the relay circuit when a fault is detected;
  a monitoring module integrated with the GFCI, the monitoring module comprising
    a simulated ground fault generator for simulating a ground fault;
    an auto-monitoring logic module;
    a relay synchronized switch; and
    an end-of-life switch for disabling the relay circuit.

10. The GFCI test guard circuit as in claim 9 wherein the auto-monitoring logic module comprises simulated ground fault signals to test GFCI circuit components, wherein the tested GFCI circuit components comprises:
  a sense transformer;
  a grounded neutral transformer;
  a GFCI Integrated Circuit (IC) coupled to the sense transformer and the grounded neutral transformer; and
  the first bi-stable electronic latch circuit.

11. The GFCI test guard as in claim 9 wherein the relay synchronized switch comprises connections to the relay circuit for synchronizing the relay circuit with the generated ground fault signals to maintain the first and second switches in the second energized position.

12. The GFCI test guard circuit as in claim 9 wherein the end-of-life (EOL) switch for disabling the relay circuit comprises a second bi-stable latch circuit operable in response to a signal from the monitoring logic module for returning the first and second switches to the first non-energized position.

* * * * *